(12) United States Patent
Wu et al.

(10) Patent No.: US 9,572,274 B2
(45) Date of Patent: Feb. 14, 2017

(54) SECURING MECHANISM (71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Shu-Qi Wu, Wuhan (CN); Yong-Chang Fan, Wuhan (CN); Yu-Lin Liu, Wuhan (CN)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 35 days.

(21) Appl. No.: 14/790,802

(22) Filed: Jul. 2, 2015

(65) Prior Publication Data
US 2016/0330853 A1 Nov. 10, 2016

(30) Foreign Application Priority Data
May 7, 2015 (CN) .......................... 2015 1 0228543

(51) Int. Cl.
| H05K 7/02 | (2006.01) |
| B65H 75/44 | (2006.01) |
| B65H 75/48 | (2006.01) |
| H02G 11/02 | (2006.01) |
| G06F 1/16 | (2006.01) |

(52) U.S. Cl.
CPC ............ *H05K 7/02* (2013.01); *B65H 75/4471* (2013.01); *B65H 75/48* (2013.01); *H02G 11/02* (2013.01); *B65H 2701/34* (2013.01); *G06F 1/1632* (2013.01)

(58) Field of Classification Search
CPC ....... H05K 7/02; B65H 75/4471; B65H 75/48; B65H 2701/34; G06F 1/1632; H02G 11/02
See application file for complete search history.

(56) References Cited

U.S. PATENT DOCUMENTS

| 6,048,211 | A | * | 4/2000 | Liaom | .................... | B65H 75/48 |
| | | | | | | 439/22 |
| 6,059,213 | A | * | 5/2000 | Phillips | .................. | B65H 75/44 |
| | | | | | | 191/12.4 |
| 6,230,860 | B1 | * | 5/2001 | Wu | ........................ | H02G 11/02 |
| | | | | | | 191/12 R |
| 6,415,898 | B1 | * | 7/2002 | Liao | ........................ | H02G 11/02 |
| | | | | | | 191/12.4 |
| 7,825,334 | B2 | * | 11/2010 | Chien | .................... | H01R 13/72 |
| | | | | | | 174/50 |

(Continued)

*Primary Examiner* — Adrian S Wilson
*Assistant Examiner* — Abhishek Rathod
(74) *Attorney, Agent, or Firm* — Zhigang Ma (57) ABSTRACT

A securing mechanism is configured to secure an electronic device. The electronic device includes a body, a power adapter and a first data cable connecting the body with the power adapter. The securing mechanism includes a base and a cover. The base includes a second data cable. The cover defines a limiting groove and a securing portion connected with the second data cable. The body is configured to be received in the limiting groove. The power adapter is configured to be inserted into the securing portion. The second data cable is configured to be inserted into a power supply.

14 Claims, 7 Drawing Sheets

(56) References Cited

U.S. PATENT DOCUMENTS

| | | | | |
|---|---|---|---|---|
| 9,161,115 B2* | 10/2015 | Schrems | ............... | H04M 1/15 |
| 2004/0129522 A1* | 7/2004 | Skowronski | ........... | H02G 11/02 |
| | | | | 191/12.2 R |
| 2005/0098405 A1* | 5/2005 | Chang | ................... | H02G 11/02 |
| | | | | 191/12.2 R |
| 2008/0117582 A1* | 5/2008 | Lai | ..................... | G06F 1/1632 |
| | | | | 361/825 |
| 2008/0123275 A1* | 5/2008 | Lai | ....................... | G06F 1/181 |
| | | | | 361/809 |
| 2008/0244145 A1* | 10/2008 | Kramlich | .............. | G06F 1/1632 |
| | | | | 710/304 |
| 2011/0075349 A1* | 3/2011 | Ma | ........................ | G06F 1/1632 |
| | | | | 361/679.41 |
| 2013/0020425 A1* | 1/2013 | Grassi | ................ | B65H 75/4431 |
| | | | | 242/388 |
| 2013/0238829 A1* | 9/2013 | Laycock | ............. | H04R 1/1033 |
| | | | | 710/303 |
| 2013/0265702 A1* | 10/2013 | Merenda | ............... | B65H 75/48 |
| | | | | 361/679.01 |

* cited by examiner

SECURING MECHANISM

CROSS-REFERENCE TO RELATED APPLICATIONS

This application claims priority to Chinese Patent Application No. 201510228543.3 filed on May 7, 2015, the contents of which are incorporated by reference herein.

FIELD

The subject matter herein generally relates to securing mechanisms, and more particularly to an electronic device securing mechanism.

BACKGROUND

An electronic device is connected with a power supply via a power adapter. However, it makes the electronic device cluttered.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

Figure 1:
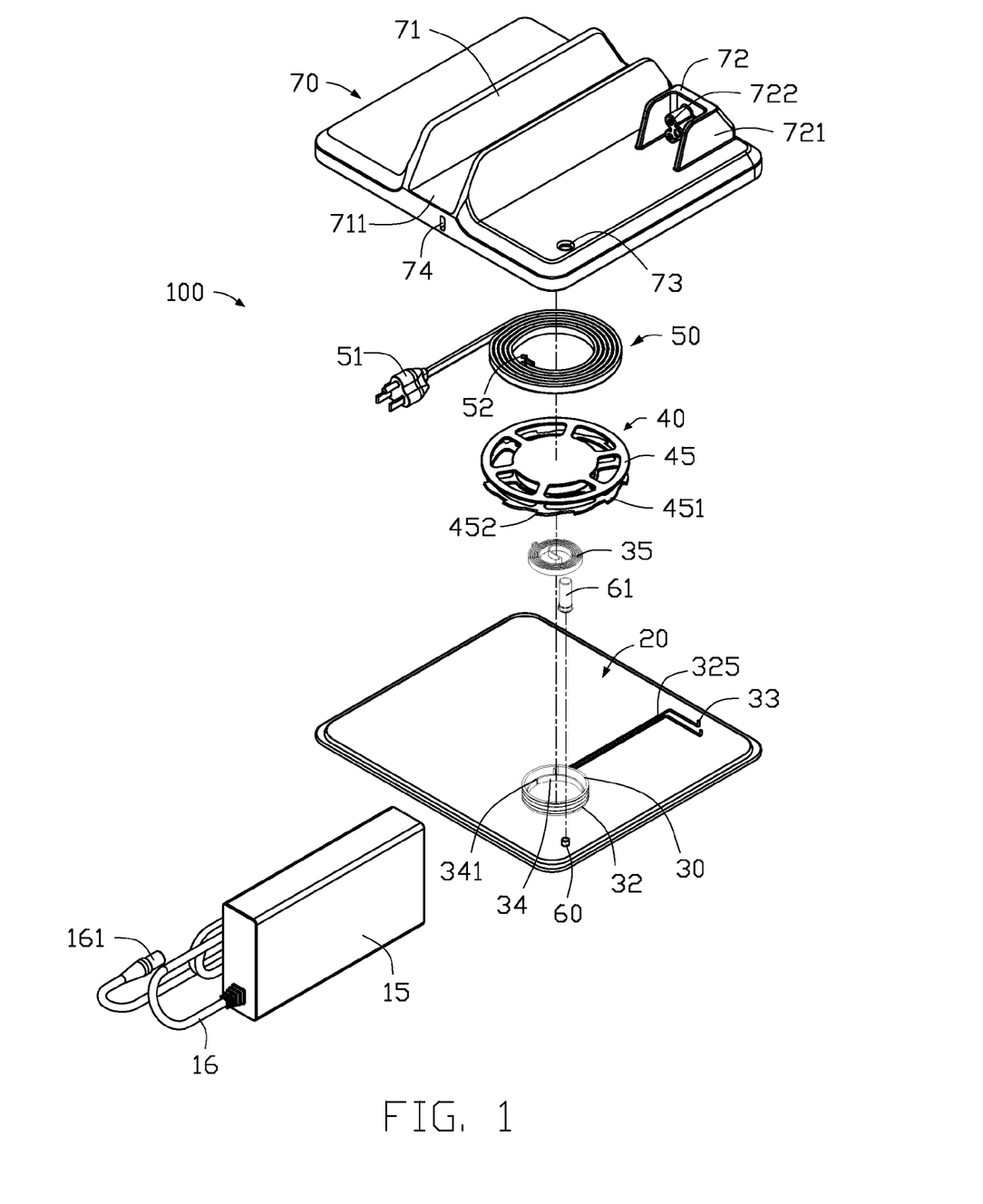
FIG. 1 is an isometric, exploded view of an embodiment of a securing mechanism and a power adapter.
Figure 5:
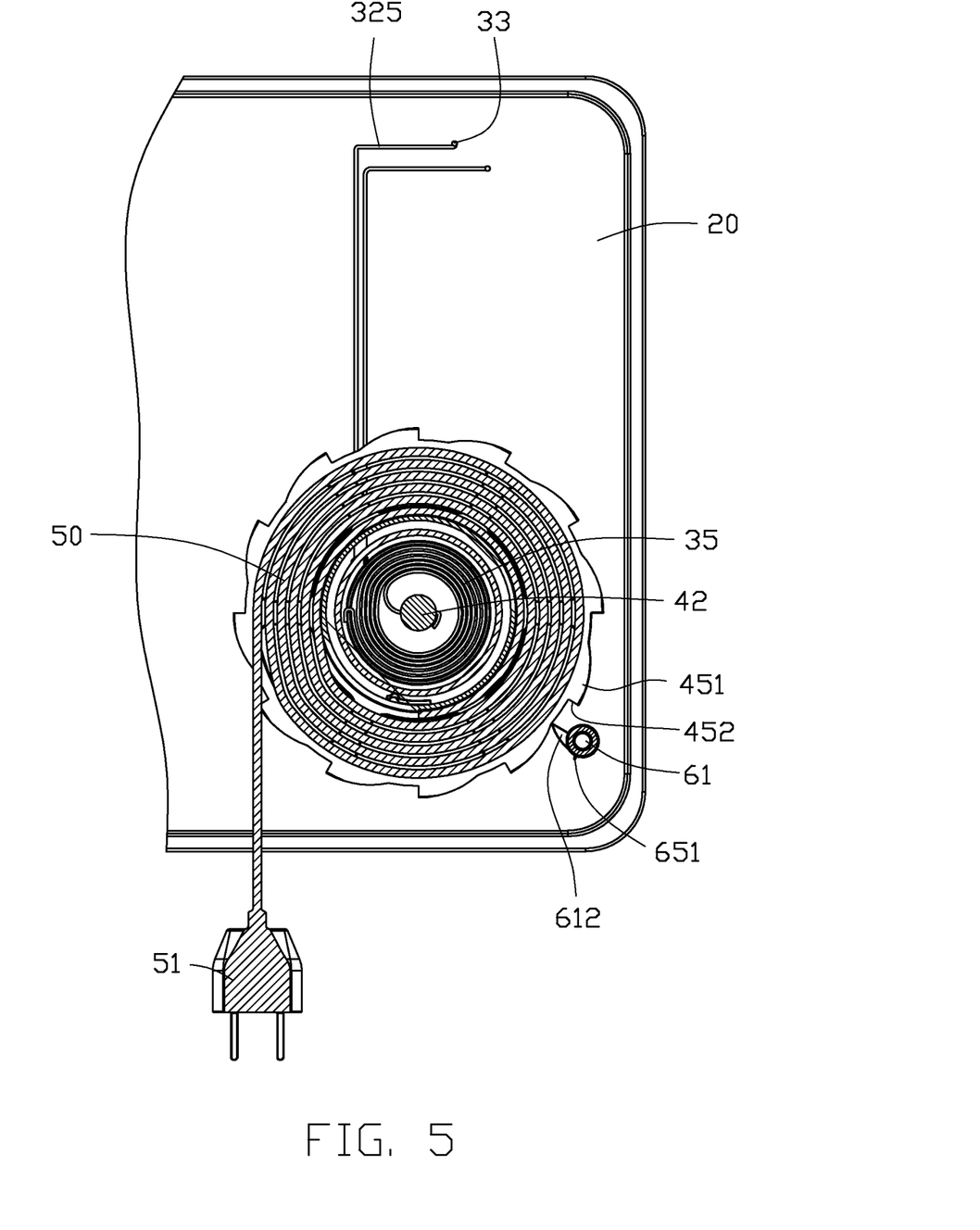
FIG. 5 is a cutaway, cross sectional view along a line V-V of FIG. 4.
Figure 6:
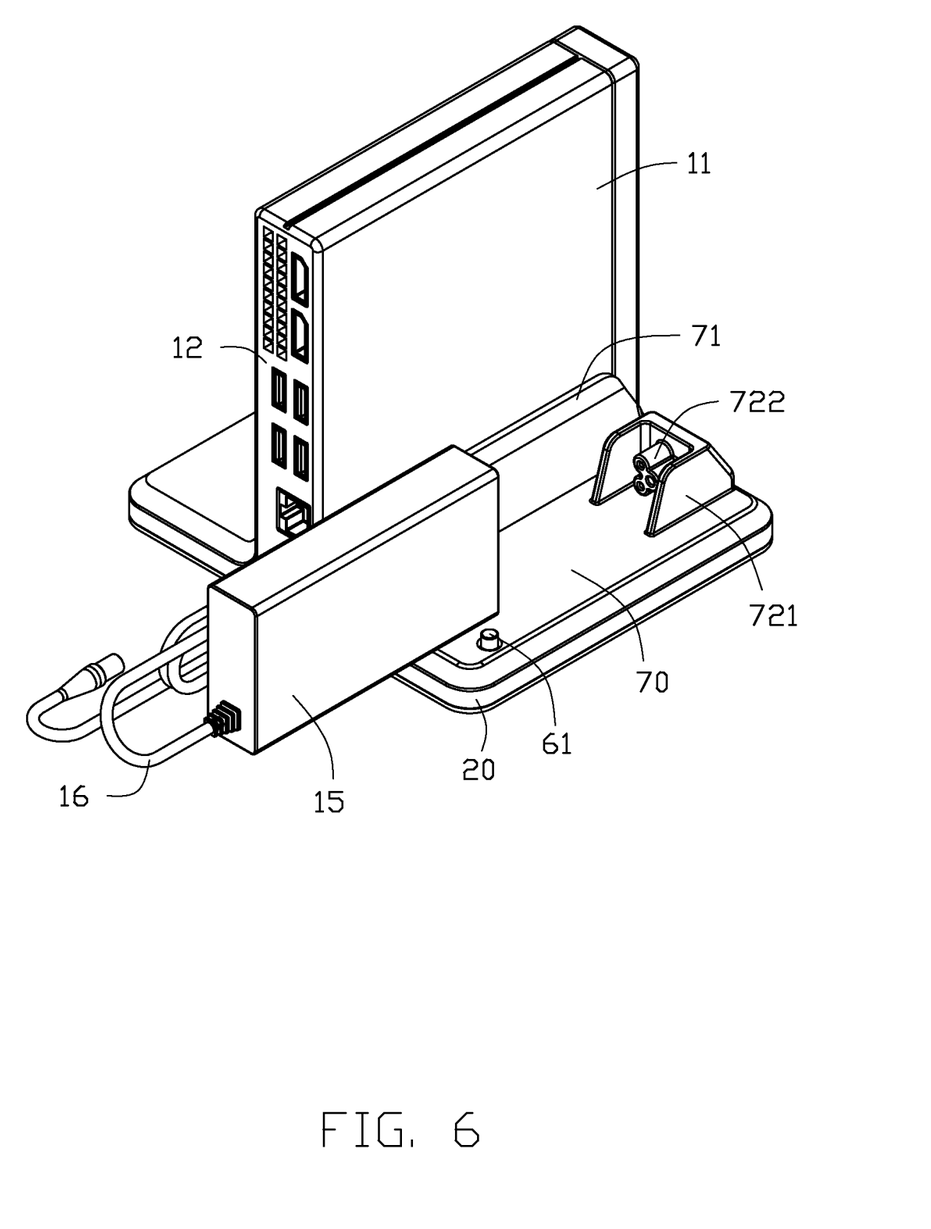
FIG. 6 is an isometric, assembled view of the securing mechanism and an electronic device of FIG. 5.
Figure 7:
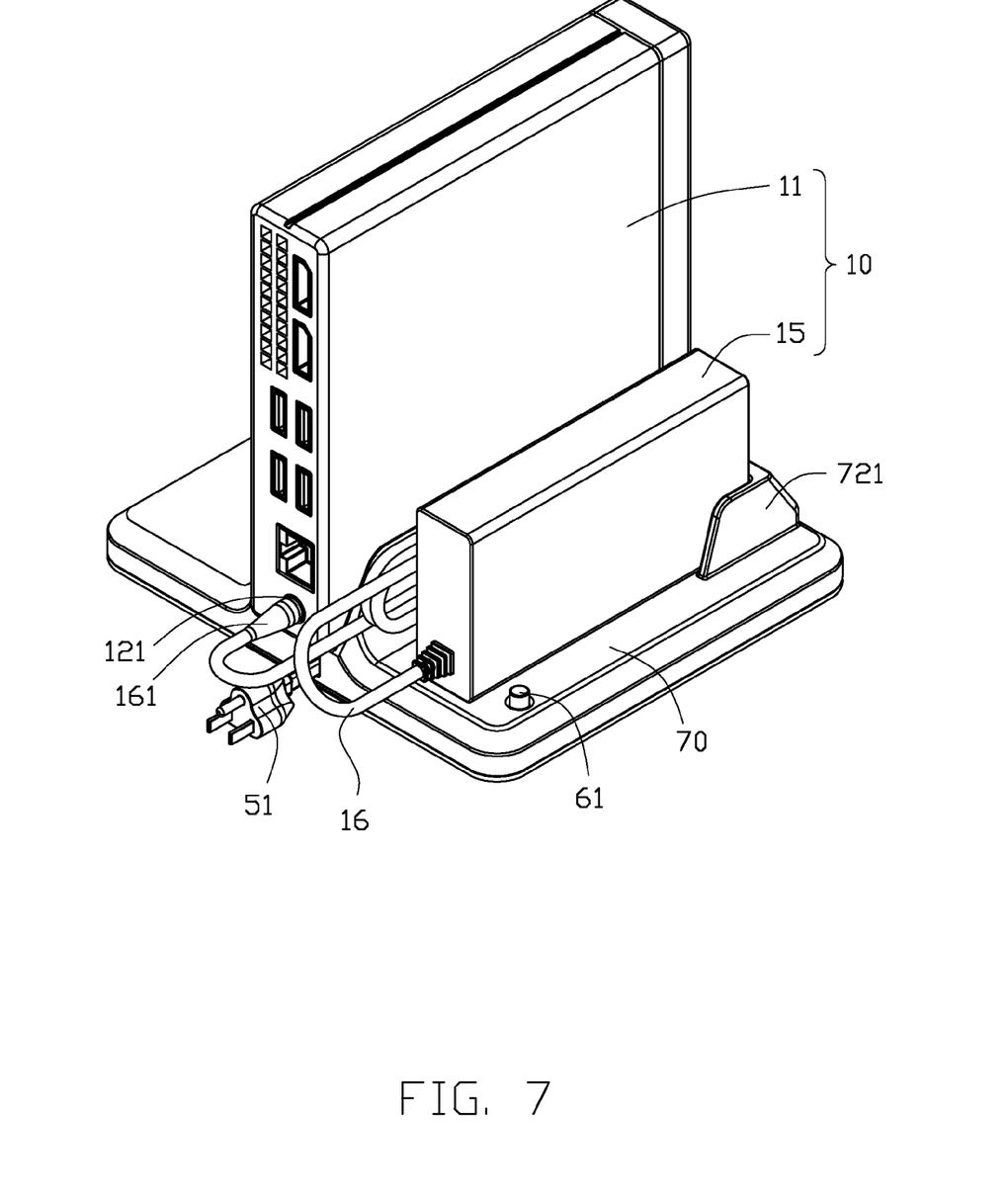
FIG. 7 is similar to FIG. 5, but viewed from a different angle.

FIGS. 1 and 5 illustrate one embodiment of a securing mechanism 100. The securing mechanism 100 is configured to secure an electronic device 10. The securing mechanism 100 includes a base 20 and a cover 70.

The electronic device 10 includes a body 11 and a power adapter 15. The body 11 includes a rear plate 12 defining an interface 121. One end of the power adapter 15 defines a port 151. A first data cable 16 is connected with another end of the power adapter 15. One end of the first data cable 16 is equipped with a joint 161.

FIG. 1 illustrates that one end of the base 20 is equipped with a sleeve 30. The sleeve 30 is roughly a circle. Two parallel receiving grooves (not shown) are located on an outer wall of the sleeve 30. Two conducting rings 32 are received in the receiving grooves. In at least one embodiment, the material of the conducting rings 32 is made of conductive material, such as copper. The conducting ring 32 is connected with a pin 33 secured on the base 20 via a conducting strip 325. A receiving ring 34 is located in the sleeve 30. The receiving ring 34 is substantially a circle and defines a gap 341. A resilient piece 35 can be elastically deformed and received in the receiving ring 34. One end of the resilient piece 35 is fixed in the gap 341.

Figure 2:
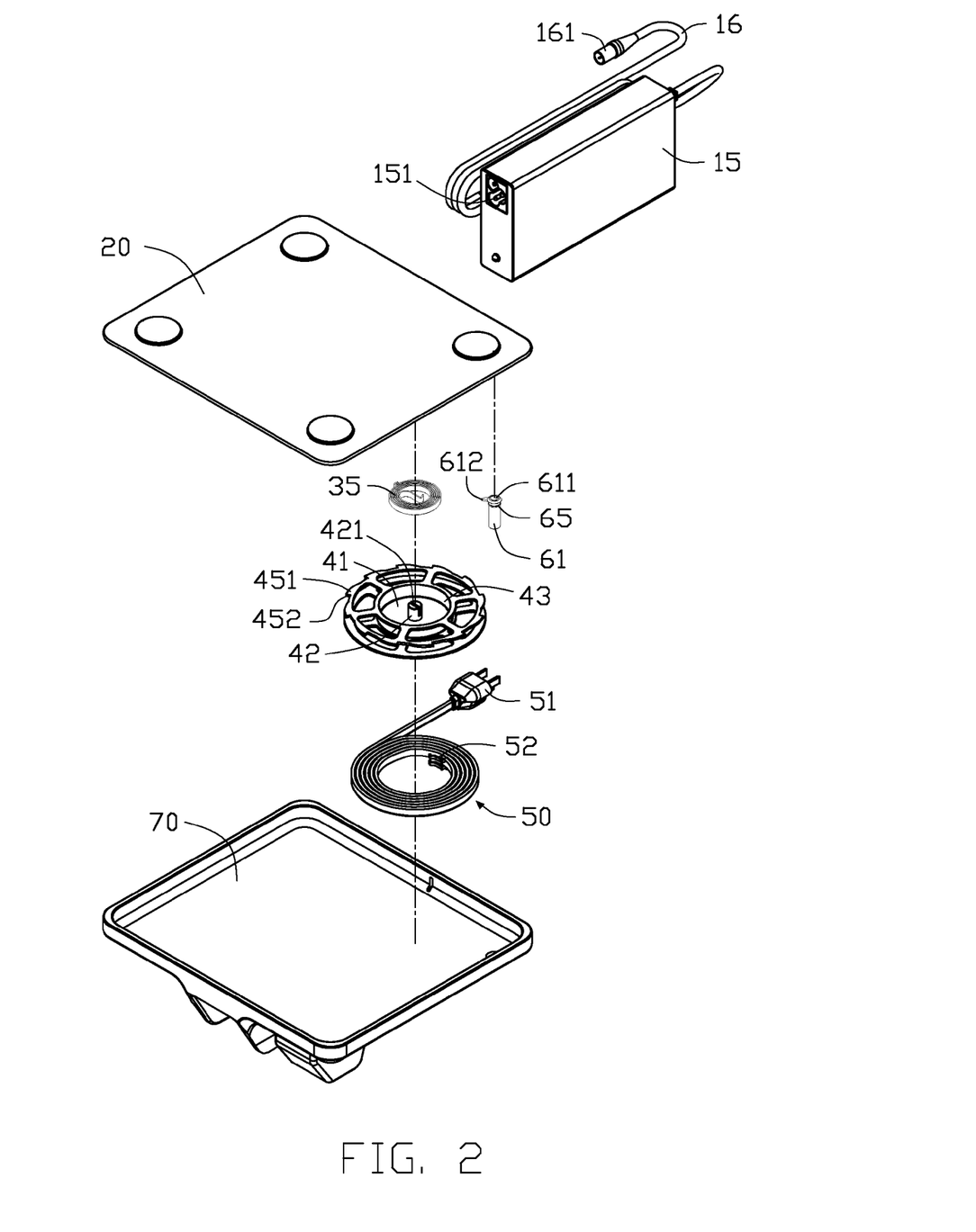
FIG. 2 is similar to FIG. 1, but viewed from another angle.

FIG. 2 illustrates that a take-up reel 40 is located on the base 20 and defines a receiving space 41. A securing shaft 42 is located in the receiving space 41. The securing shaft 42 defines a securing groove 421 along an axial direction. A stopper plate 43 is located around the receiving space 41. Two parallel rotating rings 45 are located on the rotating reel 40. A plurality of slopes 451 is located on one of the rotating rings 45. One end of the slope 451 is equipped with a stopper portion 452. A second data cable 50 is surrounding the stopper plate 43 and received between the two rotating rings 45. One end of the second data cable 50 is equipped with a plug 51. Another end of the second data cable 50 is equipped with two terminals 52.

Figure 3:
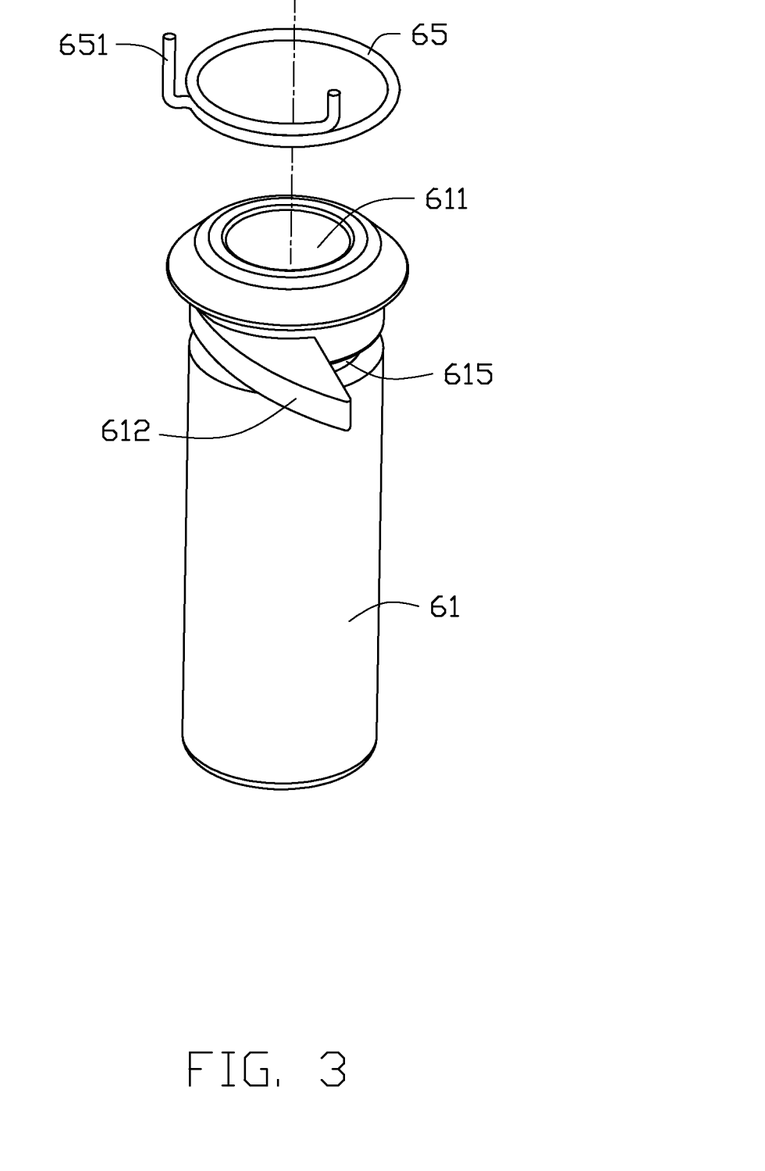
FIG. 3 is an isometric, exploded view of a button and a torsion spring of FIG. 1.
Figure 4:
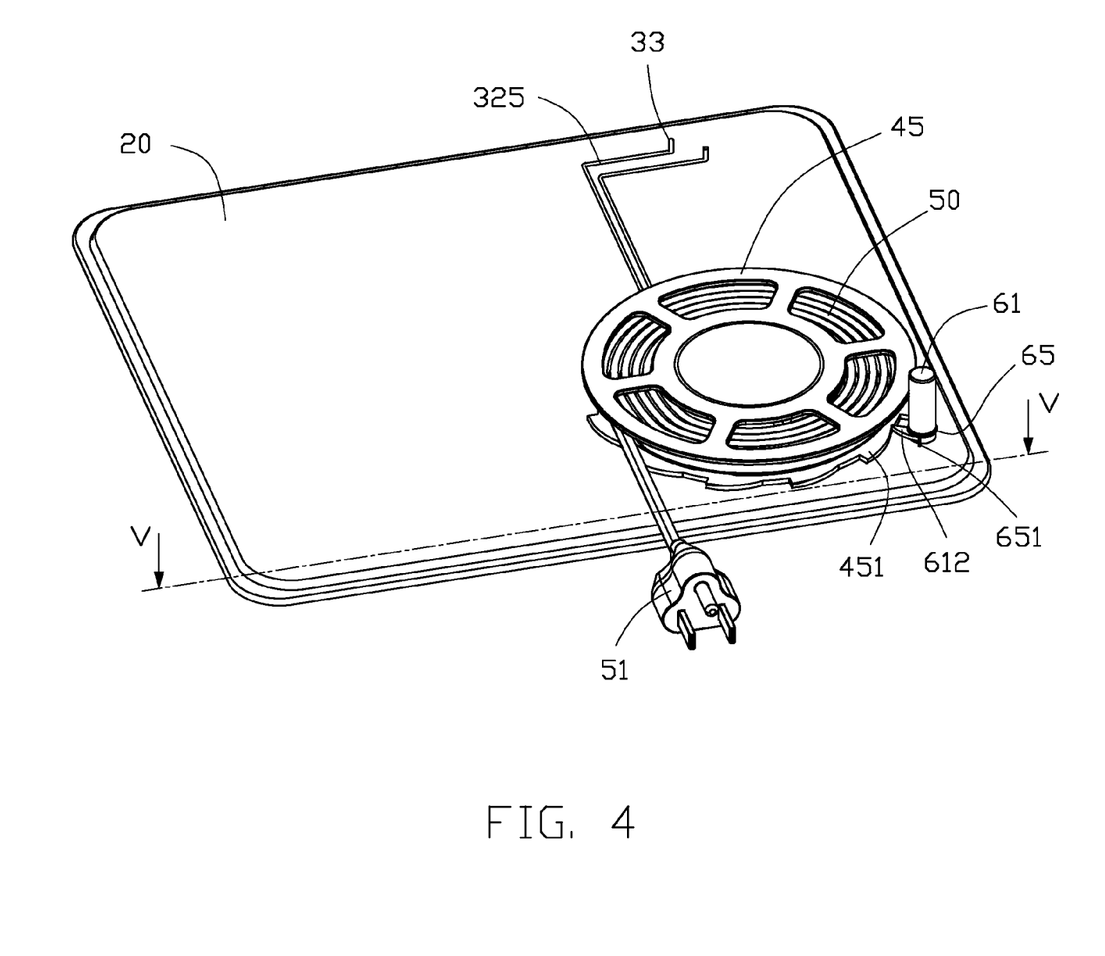
FIG. 4 is an isometric, assembled view of a base of FIG. 1.

FIGS. 1 to 3 illustrate that a positioning column 60 is located on the base 20 adjacent the sleeve 30. A button 61 is configured to be set on the positioning column 60. One end of the button 61 defines a blind hole 611 and is equipped with a stopper block 612. A latch groove 615 is located on one end of the button 61 adjacent the blind hole 611. A torsion spring 65 is received in the latch groove 615. The torsion spring includes two torsion arms 651.

The cover 70 includes two parallel limiting plates 71. A limiting groove 711 is defined between the two limiting plates 71. The cover 70 is equipped with a securing portion 72. The securing portion 72 includes two latch plates 721 and a connector 722. The cover 70 defines a positioning hole 73 and a through hole 74.

FIGS. 4 to 7 illustrate when in assembly, the two conducting rings 32 are placed on the receiving grooves of the sleeve 30 and connected with two pins 33 via the conducting strip 325. The resilient piece 35 is elastically deformed to be received in the receiving ring 34. One end of the resilient piece 35 is fixed in the gap 341. The second data cable 50 is surrounded on the stopper plate 43. The take-up reel 40 is set on the sleeve 30 and another end of the resilient piece 35 is fixed in the securing groove 421. Two terminals 52 can pass through the stopper plate 43 and are respectively electrically connected with the two conducting rings 32.

The torsion spring 65 is placed in the latch groove 615 of the button 81. The button 61 is set on the positioning column 60 and the positioning column 60 is inserted into the blind hole 611. Then, the stopper block 612 and the slope 451 are substantially located in a same plane. The button 61 is rotated to let the stopper block 612 resist against the one slope 451. One of the torsion arms 651 is fixed on the base 20; another torsion arm 651 is resisted against the stopper block 612. The cover 70 is placed on the base 20. The button 61 passes through the positioning hole 73. The pins 33 are electric connected with the securing portion 72. The second data cable 50 passes through the through hole 74 to be connected with a plug 51. Then, the securing mechanism 100 is completely assembled.

The take-up reel 40 is configured to rotate around the sleeve 30. When the take-up reel 40 rotates along a first direction, the slope 451 pushes the stopper block 612 to rotate along a second direction, when the slope 451 passes through the stopper block 612, the stopper block 612 can be returned under the drive of the torsion spring 65. When the take-up reel 40 is rotated along the second direction, the slope 451 pushes the stopper block 612 to rotate along the first direction. One of the torsion arms 651 secured in the base 20 is resisted against the stopper block 612 to prevent the stopper block 612 from rotating and preventing the take-up reel 40 from rotating along the second direction.

The body 11 is placed on the limiting groove 711. The power adapter 15 is placed between the two latch plates 721. The connector 722 is connected with the port 151 of the power adapter 15. The joint 161 is inserted into the interface 121, and then the electronic device 10 is secured on the securing mechanism 100.

When the electronic device 10 is working, the plug 51 of the second data cable 50 is inserted into a power supply to supply power to the electronic device 10. If the length of the second data cable 50 is too short, the second data cable 50 can be pulled until long enough. The take-up reel 40 can be rotated along the first direction and the resilient piece 35 is elastically deformed. The stopper block 612 is rotated along the second direction allowing the slope 451 to pass. The torsion spring 65 is elastically recovered to allow the stopper block to return. The resilient piece 35 is elastically recovered to allow the take-up reel 40 to rotate along the second direction. The stopper block 612 is resisted against the stopper portion 452 of the slope 451 to prevent the take-up reel 40 from rotating.

When the electronic device 10 is not working, the button 61 is lifted and the stopper block 612 is moved away from the securing ring 45. The resilient piece 35 is elastically recovered to allow the take-up reel 40 to rotate along the second direction to reel up the second data cable 50.

It is to be understood, however, that even though numerous characteristics and advantages of the embodiments have been set forth in the foregoing description, together with details of the structure and functions of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A securing mechanism for an electronic device comprising
a body and a power adapter coupled to the body by a first cable, the securing mechanism comprising:
a base including a second data cable, which is configured to be inserted into the power supply; and
a cover defining a limiting groove and comprising a securing portion connected with the second data cable;
wherein the limiting groove is configured to receive the body, and the securing portion is configured to receive the power adapter;
wherein the base comprises a take-up reel, and the second data cable is surrounded around the take-up reel;
wherein the base comprises a sleeve, and the take-up reel is rotatably installed on the sleeve; and
wherein two receiving grooves are located on the outer wall of the sleeve, and two conducting rings are received in the receiving grooves.

2. The securing mechanism of claim 1, wherein the conducting ring is connected with a pin fixed on the base via a conducting strip, and the pin can be connected with the securing portion.

3. The securing mechanism of claim 1, wherein a receiving ring defines a gap, one end of the resilient piece is fixed in the gap.

4. The securing mechanism of claim 3, wherein the take-up reel is equipped with a securing shaft, and the securing shaft defines a securing groove, another end of the resilient piece is fixed in the securing groove.

5. The securing mechanism of claim 4, wherein the base comprises a positioning column, a button is rotatably installed on the positioning column, and the button is configured to be resisted against the take-up reel to prevent the take-up reel rotating.

6. The securing mechanism of claim 5, wherein a plurality of slope is located around the take-up reel, one end of the slope is equipped with a stopper portion, and the button can be resisted against the stopper portion to prevent the take-up reel rotating.

7. The securing mechanism of claim 1, wherein a receiving ring is located in the sleeve, a resilient piece is received in the receiving ring, and the resilient piece can be elastically deformed.

8. An electronic device combination, comprising:
an electronic device comprises a body, a power adapter and a first data cable connecting the body with the power adapter;
a base comprising a second data cable; and
a cover defining a limiting groove, the cover comprises a securing portion connected with the second data cable;
wherein the body is configured to be received in the limiting groove, the power adapter is configured to be inserted into the securing portion, the second data cable is configured to be inserted into a power supply;
wherein the base comprises a take-up reel, and the second data cable is surrounded around the take-up reel;
wherein the base comprises a sleeve, and the take-up reel is rotatably installed on the sleeve; and
wherein two receiving grooves are located on the outer wall of the sleeve, and two conducting rings are received in the receiving grooves.

9. The electronic device combination of claim 8, wherein the conducting ring is connected with a pin fixed on the base via a conducting strip, and the pin can be connected with the securing portion.

10. The electronic device combination of claim 8, wherein a receiving ring defines a gap, one end of the resilient piece is fixed in the gap.

11. The electronic device combination of claim 10, wherein the take-up reel is equipped with a securing shaft, and the securing shaft defines a securing groove, another end of the resilient piece is fixed in the securing groove.

12. The electronic device combination of claim 11, wherein the base comprises a positioning column, a button is rotatably installed on the positioning column, and the button is configured to be resisted against the take-up reel to prevent the take-up reel rotating.

13. The electronic device combination of claim 12, wherein a plurality of slope is located around the take-up reel, one end of the slope is equipped with a stopper portion, and the button can be resisted against the stopper portion to prevent the take-up reel rotating.

14. The electronic device combination of claim 8, wherein a receiving ring is located in the sleeve, a resilient piece is received in the receiving ring, and the resilient piece can be elastically deformed.

* * * * *